United States Patent
Färm et al.

(10) Patent No.: US 11,081,342 B2
(45) Date of Patent: Aug. 3, 2021

(54) SELECTIVE DEPOSITION USING HYDROPHOBIC PRECURSORS

(71) Applicant: ASM IP HOLDING B.V., Almere (NL)

(72) Inventors: Elina Färm, Helsinki (FI); Hidemi Suemori, Helsinki (FI); Raija Matero, Helsinki (FI); Antti Niskanen, Helsinki (FI); Suvi P. Haukka, Helsinki (FI); Eva Tois, Espoo (FI)

(73) Assignee: ASM IP HOLDING B.V., Almere (NL)

( * ) Notice: Subject to any disclaimer, the term of this patent is extended or adjusted under 35 U.S.C. 154(b) by 295 days.

(21) Appl. No.: 15/581,726

(22) Filed: Apr. 28, 2017

(65) Prior Publication Data
US 2017/0323776 A1 Nov. 9, 2017

Related U.S. Application Data (60) Provisional application No. 62/332,396, filed on May 5, 2016.

(51) Int. Cl.
*H01L 21/02* (2006.01)
*C23C 16/40* (2006.01)
(Continued)

(52) U.S. Cl.
CPC .......... *H01L 21/0228* (2013.01); *C23C 16/40* (2013.01); *C23C 16/405* (2013.01);
(Continued)

(58) Field of Classification Search
CPC .......... H01L 21/02181; H01L 21/0228; H01L 21/02189; C23C 16/40; C23C 16/45525
(Continued)

(56) References Cited

U.S. PATENT DOCUMENTS

| 4,804,640 A | 2/1989 | Kaganowicz |
| 4,863,879 A | 9/1989 | Kwok |

(Continued)

FOREIGN PATENT DOCUMENTS

| EP | 0469456 A1 | 2/1992 |
| EP | 0880168 A2 | 11/1998 |

(Continued)

OTHER PUBLICATIONS

Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.

(Continued)

*Primary Examiner* — Mohammad M Choudhry
(74) *Attorney, Agent, or Firm* — Knobbe, Martens, Olson & Bear LLP (57) ABSTRACT

Vapor deposition processes are provided in which a material is selectively deposited on a first surface of a substrate relative to a second organic surface. In some embodiments a substrate comprising a first surface, such as a metal, semi-metal or oxidized metal or semi-metal is contacted with a first vapor phase hydrophobic reactant and a second vapor phase reactant such that the material is deposited selectively on the first surface relative to the second organic surface. The second organic surface may comprise, for example, a self-assembled monolayer, a directed self-assembled layer, or a polymer, such as a polyimide, polyamide, polyuria or polystyrene. The material that is deposited may be, for example, a metal or metallic material. In some embodiments the material is a metal oxide, such as $ZrO_2$ or $HfO_2$. In some embodiments the vapor deposition process is a cyclic chemical vapor deposition (CVD) process or an atomic layer deposition (ALD) process. In some
(Continued)

embodiments the material is deposited on the first surface relative to the second surface with a selectivity of greater than about 50%, greater than about 60%, greater than about 70%, greater than about 80%, greater than about 90% or greater than about 95%.

23 Claims, 7 Drawing Sheets

(51) Int. Cl.
    *C23C 16/455*     (2006.01)
    *H01L 21/32*     (2006.01)

(52) U.S. Cl.
    CPC .. *C23C 16/45525* (2013.01); *C23C 16/45553* (2013.01); *H01L 21/02181* (2013.01); *H01L 21/02189* (2013.01); *H01L 21/32* (2013.01)

(58) Field of Classification Search
    USPC ......................................................... 438/785
    See application file for complete search history.

(56) References Cited

U.S. PATENT DOCUMENTS

| | | | |
|---|---|---|---|
| 4,948,755 | A | 8/1990 | Mo |
| 5,288,697 | A | 2/1994 | Schrepp et al. |
| 5,447,887 | A | 9/1995 | Filipiak et al. |
| 5,604,153 | A | 2/1997 | Tsubouchi et al. |
| 5,633,036 | A | 5/1997 | Seebauer et al. |
| 5,869,135 | A | 2/1999 | Vaeth et al. |
| 5,925,494 | A | 7/1999 | Horn |
| 6,046,108 | A | 4/2000 | Liu et al. |
| 6,416,577 | B1 | 7/2002 | Suntoloa et al. |
| 6,426,015 | B1 | 7/2002 | Xia et al. |
| 6,455,414 | B1 | 9/2002 | Hillman et al. |
| 6,482,740 | B2 | 11/2002 | Soininen et al. |
| 6,586,330 | B1 | 7/2003 | Ludviksson et al. |
| 6,679,951 | B2 | 1/2004 | Soininen et al. |
| 6,759,325 | B2 | 7/2004 | Raaijmakers et al. |
| 6,811,448 | B1 | 11/2004 | Paton |
| 6,844,258 | B1 | 1/2005 | Fair et al. |
| 6,852,635 | B2 | 2/2005 | Satta et al. |
| 6,858,533 | B2 | 2/2005 | Chu et al. |
| 6,878,628 | B2 | 4/2005 | Sophie et al. |
| 6,887,795 | B2 | 5/2005 | Soininen et al. |
| 6,921,712 | B2 | 7/2005 | Soininen et al. |
| 6,958,174 | B1 | 10/2005 | Klaus et al. |
| 7,041,609 | B2 | 5/2006 | Vaartstra |
| 7,067,407 | B2 | 6/2006 | Kostamo et al. |
| 7,084,060 | B1 | 8/2006 | Furukawa et al. |
| 7,118,779 | B2 | 10/2006 | Verghese et al. |
| 7,220,669 | B2 | 5/2007 | Hujanen et al. |
| 7,241,677 | B2 | 7/2007 | Soininen et al. |
| 7,323,411 | B1 | 1/2008 | Blosse |
| 7,405,143 | B2 | 7/2008 | Leinikka et al. |
| 7,425,350 | B2 | 9/2008 | Todd |
| 7,476,618 | B2 | 1/2009 | Kilpela et al. |
| 7,494,927 | B2 | 2/2009 | Kostamo et al. |
| 7,595,271 | B2 | 9/2009 | White |
| 7,611,751 | B2 | 11/2009 | Elers |
| 7,695,567 | B2 | 4/2010 | Fu |
| 7,754,621 | B2 | 7/2010 | Putkonen |
| 7,790,631 | B2 | 9/2010 | Sharma et al. |
| 7,799,135 | B2 | 9/2010 | Verghese et al. |
| 7,910,177 | B2 | 3/2011 | Li |
| 7,914,847 | B2 | 3/2011 | Verghese et al. |
| 7,927,942 | B2 | 4/2011 | Raaijmakers |
| 7,951,637 | B2 | 5/2011 | Weidman et al. |
| 7,955,979 | B2 | 6/2011 | Kostamo et al. |
| 7,964,505 | B2 | 6/2011 | Khandelwal et al. |
| 8,173,554 | B2 | 5/2012 | Lee et al. |
| 8,293,597 | B2 | 10/2012 | Raaijmakers |
| 8,293,658 | B2 | 10/2012 | Shero et al. |
| 8,425,739 | B1 | 4/2013 | Wieting |
| 8,466,052 | B2 | 6/2013 | Baek et al. |
| 8,536,058 | B2 | 9/2013 | Kostamo et al. |
| 8,623,468 | B2 | 1/2014 | Lin et al. |
| 8,778,815 | B2 | 7/2014 | Yamaguchi et al. |
| 8,890,264 | B2 | 11/2014 | Dewey et al. |
| 8,956,971 | B2 | 2/2015 | Haukka et al. |
| 8,962,482 | B2 | 2/2015 | Albertson et al. |
| 8,980,418 | B2 | 3/2015 | Darling et al. |
| 8,993,404 | B2 | 3/2015 | Kobrinsky et al. |
| 9,067,958 | B2 | 6/2015 | Romero |
| 9,112,003 | B2 | 8/2015 | Haukka et al. |
| 9,129,897 | B2 | 9/2015 | Pore et al. |
| 9,136,110 | B2 | 9/2015 | Rathsack |
| 9,159,558 | B2 | 10/2015 | Cheng et al. |
| 9,236,292 | B2 | 1/2016 | Romero et al. |
| 9,257,303 | B2 | 2/2016 | Haukka et al. |
| 9,312,131 | B2 | 4/2016 | Bauer et al. |
| 9,349,687 | B1 | 5/2016 | Gates et al. |
| 9,353,139 | B2 | 5/2016 | Sundermeyer et al. |
| 9,455,138 | B1 | 9/2016 | Fukazawa et al. |
| 9,490,145 | B2 | 11/2016 | Niskanen et al. |
| 9,502,289 | B2 | 11/2016 | Haukka et al. |
| 9,552,979 | B2 | 1/2017 | Knaepen et al. |
| 9,679,808 | B2 | 6/2017 | Haukka et al. |
| 9,786,491 | B2 | 10/2017 | Suzuki et al. |
| 9,786,492 | B2 | 10/2017 | Suzuki et al. |
| 9,803,277 | B1 | 10/2017 | Longrie et al. |
| 9,805,974 | B1 | 10/2017 | Chen et al. |
| 9,816,180 | B2 | 11/2017 | Haukka et al. |
| 9,895,715 | B2 | 2/2018 | Haukka et al. |
| 9,911,595 | B1 | 3/2018 | Smith et al. |
| 10,014,212 | B2 | 7/2018 | Chen et al. |
| 10,041,166 | B2 | 8/2018 | Longrie et al. |
| 10,047,435 | B2 | 8/2018 | Haukka et al. |
| 10,049,924 | B2 | 8/2018 | Haukka et al. |
| 10,115,603 | B2 | 10/2018 | Niskanen et al. |
| 10,157,786 | B2 | 12/2018 | Haukka et al. |
| 10,186,420 | B2 | 1/2019 | Fukazawa |
| 10,204,782 | B2 | 2/2019 | Maes et al. |
| 10,343,186 | B2 | 7/2019 | Pore et al. |
| 10,373,820 | B2 | 8/2019 | Tois et al. |
| 10,428,421 | B2 | 10/2019 | Haukka et al. |
| 10,443,123 | B2 | 10/2019 | Haukka et al. |
| 10,453,701 | B2 | 10/2019 | Tois et al. |
| 10,480,064 | B2 | 11/2019 | Longrie et al. |
| 10,546,741 | B2 | 1/2020 | Muramaki et al. |
| 10,695,794 | B2 | 6/2020 | Pore et al. |
| 10,847,363 | B2 | 11/2020 | Tapily |
| 10,900,120 | B2 | 1/2021 | Sharma et al. |
| 2001/0019803 | A1 | 9/2001 | Mirkanimi |
| 2001/0021414 | A1 | 9/2001 | Morishima et al. |
| 2001/0025205 | A1 | 9/2001 | Chern et al. |
| 2002/0027261 | A1* | 3/2002 | Besser ............... H01L 21/7684 257/584 |
| 2002/0047144 | A1 | 4/2002 | Nguyen et al. |
| 2002/0068458 | A1 | 6/2002 | Chiang et al. |
| 2002/0090777 | A1 | 7/2002 | Forbes et al. |
| 2002/0107316 | A1* | 8/2002 | Bice ..................... B82Y 30/00 524/493 |
| 2003/0027431 | A1 | 2/2003 | Sneh et al. |
| 2003/0066487 | A1 | 4/2003 | Suzuki |
| 2003/0143839 | A1 | 7/2003 | Raaijmakers et al. |
| 2003/0176559 | A1* | 9/2003 | Bice ..................... B82Y 30/00 524/492 |
| 2003/0181035 | A1 | 9/2003 | Yoon et al. |
| 2003/0185997 | A1 | 10/2003 | Hsieh |
| 2003/0192090 | P1 | 10/2003 | Meilland |
| 2003/0193090 | A1 | 10/2003 | Otani et al. |
| 2004/0092073 | A1 | 5/2004 | Cabral |
| 2004/0129558 | A1 | 7/2004 | Liu et al. |
| 2004/0219746 | A1 | 7/2004 | Vaartstra et al. |
| 2005/0012975 | A1* | 1/2005 | George ................ B81B 3/0005 438/48 |
| 2005/0136604 | A1 | 6/2005 | Al-Bayati et al. |
| 2005/0160575 | A1 | 7/2005 | Gambino et al. |
| 2005/0223989 | A1 | 10/2005 | Lee et al. |
| 2006/0019493 | A1 | 1/2006 | Li |
| 2006/0047132 | A1 | 3/2006 | Shenai-Khatkhate et al. |

(56) References Cited

U.S. PATENT DOCUMENTS

| | | |
|---|---|---|
| 2006/0121271 A1* | 6/2006 | Frey .................. C23C 18/1603 428/333 |
| 2006/0121677 A1 | 6/2006 | Parekh et al. |
| 2006/0121733 A1 | 6/2006 | Kilpela et al. |
| 2006/0128150 A1 | 6/2006 | Gandikota et al. |
| 2006/0141155 A1 | 6/2006 | Gordon et al. |
| 2006/0156979 A1 | 7/2006 | Thakur et al. |
| 2006/0176559 A1 | 8/2006 | Minoda et al. |
| 2006/0199399 A1 | 9/2006 | Muscat |
| 2006/0226409 A1 | 10/2006 | Burr et al. |
| 2006/0292845 A1 | 12/2006 | Chiang et al. |
| 2007/0014919 A1 | 1/2007 | Hamalainen et al. |
| 2007/0026654 A1 | 2/2007 | Huotari et al. |
| 2007/0036892 A1 | 2/2007 | Haukka et al. |
| 2007/0063317 A1 | 3/2007 | Kim et al. |
| 2007/0098894 A1 | 5/2007 | Verghese et al. |
| 2007/0099422 A1 | 5/2007 | Wijekoon et al. |
| 2007/0232082 A1 | 10/2007 | Balseanu et al. |
| 2007/0241390 A1 | 10/2007 | Tanaka et al. |
| 2007/0251444 A1 | 11/2007 | Gros-Jean et al. |
| 2007/0292604 A1 | 12/2007 | Dordi et al. |
| 2008/0066680 A1 | 3/2008 | Sherman |
| 2008/0072819 A1 | 3/2008 | Rahtu |
| 2008/0124932 A1 | 5/2008 | Tateishi et al. |
| 2008/0179741 A1 | 7/2008 | Streck et al. |
| 2008/0241575 A1 | 10/2008 | Lavoie et al. |
| 2008/0282970 A1 | 11/2008 | Heys et al. |
| 2009/0035949 A1 | 2/2009 | Niinisto et al. |
| 2009/0071505 A1 | 3/2009 | Miya et al. |
| 2009/0081385 A1 | 3/2009 | Heys et al. |
| 2009/0203222 A1 | 8/2009 | Dussarrat et al. |
| 2009/0269507 A1 | 10/2009 | Yu et al. |
| 2009/0274887 A1 | 11/2009 | Millward et al. |
| 2009/0275163 A1 | 11/2009 | Lacey et al. |
| 2009/0311879 A1 | 12/2009 | Blasco et al. |
| 2010/0015756 A1 | 1/2010 | Weidman et al. |
| 2010/0102417 A1 | 4/2010 | Ganguli et al. |
| 2010/0147396 A1 | 6/2010 | Yamagishi et al. |
| 2010/0178468 A1 | 7/2010 | Jiang et al. |
| 2010/0248473 A1 | 9/2010 | Ishizaka et al. |
| 2010/0270626 A1 | 10/2010 | Raisanen |
| 2010/0297474 A1 | 11/2010 | Dameron |
| 2010/0314765 A1 | 12/2010 | Liang et al. |
| 2011/0039420 A1 | 2/2011 | Nakao |
| 2011/0053800 A1 | 3/2011 | Jung et al. |
| 2011/0120542 A1 | 5/2011 | Levy |
| 2011/0124192 A1 | 5/2011 | Ganguli et al. |
| 2011/0146568 A1* | 6/2011 | Haukka .............. C23C 16/45555 118/200 |
| 2011/0146703 A1 | 6/2011 | Chen et al. |
| 2011/0198756 A1 | 8/2011 | Thenappan et al. |
| 2011/0221061 A1 | 9/2011 | Prakash |
| 2011/0244680 A1 | 10/2011 | Tohnoe et al. |
| 2011/0311726 A1 | 12/2011 | Liu et al. |
| 2012/0032311 A1 | 2/2012 | Gates |
| 2012/0046421 A1 | 2/2012 | Darling et al. |
| 2012/0052681 A1 | 3/2012 | Marsh |
| 2012/0088369 A1 | 4/2012 | Weidman et al. |
| 2012/0091541 A1 | 4/2012 | Suchomel et al. |
| 2012/0189868 A1 | 7/2012 | Borovik et al. |
| 2012/0219824 A1 | 8/2012 | Prolier et al. |
| 2012/0241411 A1 | 9/2012 | Darling et al. |
| 2012/0264291 A1 | 10/2012 | Ganguli et al. |
| 2012/0269970 A1 | 10/2012 | Ido et al. |
| 2013/0005133 A1 | 1/2013 | Lee et al. |
| 2013/0078793 A1 | 3/2013 | Sun et al. |
| 2013/0084700 A1 | 4/2013 | Swerts et al. |
| 2013/0089983 A1 | 4/2013 | Sugita et al. |
| 2013/0095664 A1 | 4/2013 | Matero et al. |
| 2013/0115763 A1 | 5/2013 | Takamure et al. |
| 2013/0115768 A1 | 5/2013 | Pore et al. |
| 2013/0126815 A1 | 5/2013 | Kim et al. |
| 2013/0143401 A1 | 6/2013 | Yu et al. |
| 2013/0146881 A1 | 6/2013 | Yamazaki et al. |
| 2013/0157409 A1 | 6/2013 | Vaidya et al. |
| 2013/0189790 A1 | 7/2013 | Li et al. |
| 2013/0189837 A1 | 7/2013 | Haukka et al. |
| 2013/0196502 A1* | 8/2013 | Haukka .............. H01L 21/02068 438/653 |
| 2013/0203267 A1 | 8/2013 | Pomarede et al. |
| 2013/0280919 A1 | 10/2013 | Yuasa et al. |
| 2013/0284094 A1 | 10/2013 | Pavol et al. |
| 2013/0309457 A1 | 11/2013 | Rathsack et al. |
| 2013/0316080 A1 | 11/2013 | Yamaguchi et al. |
| 2013/0319290 A1 | 12/2013 | Xiao et al. |
| 2013/0323930 A1 | 12/2013 | Chattopadhyay et al. |
| 2014/0001572 A1 | 1/2014 | Bohr et al. |
| 2014/0024200 A1 | 1/2014 | Kato et al. |
| 2014/0091308 A1 | 4/2014 | Dasgupta et al. |
| 2014/0120738 A1 | 5/2014 | Jung et al. |
| 2014/0152383 A1 | 6/2014 | Nikonov et al. |
| 2014/0190409 A1 | 7/2014 | Matsumoto et al. |
| 2014/0193598 A1 | 7/2014 | Traser et al. |
| 2014/0205766 A1 | 7/2014 | Lyon et al. |
| 2014/0209022 A1 | 7/2014 | Inoue et al. |
| 2014/0227461 A1 | 8/2014 | Darwish et al. |
| 2014/0252487 A1 | 9/2014 | Stephens et al. |
| 2014/0272194 A1 | 9/2014 | Xiao et al. |
| 2014/0273290 A1 | 9/2014 | Somervell |
| 2014/0273477 A1 | 9/2014 | Niskanen et al. |
| 2014/0273514 A1 | 9/2014 | Somervell et al. |
| 2014/0273523 A1 | 9/2014 | Rathsack |
| 2014/0273527 A1 | 9/2014 | Niskanen et al. |
| 2015/0004317 A1 | 1/2015 | Dussarrat et al. |
| 2015/0004319 A1 | 1/2015 | Mizue |
| 2015/0004806 A1 | 1/2015 | Ndiege et al. |
| 2015/0011032 A1 | 1/2015 | Kunimatsu et al. |
| 2015/0011093 A1 | 1/2015 | Singh et al. |
| 2015/0037972 A1 | 2/2015 | Danek et al. |
| 2015/0064931 A1 | 3/2015 | Kumagi et al. |
| 2015/0083415 A1* | 3/2015 | Monroe .................. C09K 8/524 166/276 |
| 2015/0087158 A1 | 3/2015 | Sugita et al. |
| 2015/0093890 A1 | 4/2015 | Blackwell et al. |
| 2015/0097292 A1 | 4/2015 | He et al. |
| 2015/0118863 A1 | 4/2015 | Rathod et al. |
| 2015/0162214 A1 | 6/2015 | Thompson et al. |
| 2015/0170961 A1 | 6/2015 | Romero et al. |
| 2015/0179798 A1 | 6/2015 | Clendenning et al. |
| 2015/0217330 A1 | 8/2015 | Haukka et al. |
| 2015/0240121 A1 | 8/2015 | Sugita et al. |
| 2015/0275355 A1 | 10/2015 | Mallikarjunan et al. |
| 2015/0299848 A1 | 10/2015 | Haukka et al. |
| 2015/0371866 A1 | 12/2015 | Chen et al. |
| 2015/0372205 A1 | 12/2015 | Kimura et al. |
| 2015/0376211 A1 | 12/2015 | Girard et al. |
| 2016/0075884 A1 | 3/2016 | Chen |
| 2016/0079524 A1 | 3/2016 | Do et al. |
| 2016/0086850 A1 | 3/2016 | Romero et al. |
| 2016/0152640 A1 | 6/2016 | Kuchenbeiser et al. |
| 2016/0172189 A1 | 6/2016 | Tapily |
| 2016/0186004 A1 | 6/2016 | Hustad et al. |
| 2016/0190060 A1 | 6/2016 | Bristol et al. |
| 2016/0222504 A1 | 8/2016 | Haukka et al. |
| 2016/0247695 A1 | 8/2016 | Niskanen et al. |
| 2016/0276208 A1 | 9/2016 | Haukka et al. |
| 2016/0284568 A1 | 9/2016 | Morris et al. |
| 2016/0293384 A1 | 10/2016 | Yan et al. |
| 2016/0293398 A1 | 10/2016 | Danek et al. |
| 2016/0315191 A1 | 10/2016 | Tsai et al. |
| 2016/0346838 A1 | 12/2016 | Fujita et al. |
| 2016/0365280 A1 | 12/2016 | Brink et al. |
| 2017/0037513 A1 | 2/2017 | Haukka et al. |
| 2017/0040164 A1 | 2/2017 | Wang et al. |
| 2017/0051405 A1 | 2/2017 | Fukazawa et al. |
| 2017/0058401 A1 | 3/2017 | Blackwell et al. |
| 2017/0069527 A1 | 3/2017 | Haukka et al. |
| 2017/0100742 A1 | 4/2017 | Pore et al. |
| 2017/0100743 A1 | 4/2017 | Pore et al. |
| 2017/0107413 A1* | 4/2017 | Wang .................. C03C 17/34 |
| 2017/0154806 A1 | 6/2017 | Wang et al. |
| 2017/0298503 A1 | 10/2017 | Maes et al. |
| 2017/0301542 A1 | 10/2017 | Maes et al. |
| 2017/0323776 A1 | 11/2017 | Färm et al. |

(56) References Cited

U.S. PATENT DOCUMENTS

| | | |
|---|---|---|
| 2017/0332179 A1 | 11/2017 | Bright et al. |
| 2017/0352533 A1 | 12/2017 | Tois et al. |
| 2017/0352550 A1 | 12/2017 | Tois et al. |
| 2017/0358482 A1 | 12/2017 | Chen et al. |
| 2018/0010247 A1 | 1/2018 | Niskanen et al. |
| 2018/0040708 A1 | 2/2018 | Narayanan et al. |
| 2018/0073136 A1 | 3/2018 | Haukka et al. |
| 2018/0080121 A1 | 3/2018 | Longrie et al. |
| 2018/0096888 A1 | 4/2018 | Naik et al. |
| 2018/0142348 A1 | 5/2018 | Yu et al. |
| 2018/0151345 A1 | 5/2018 | Haukka et al. |
| 2018/0151355 A1 | 5/2018 | Fukazawa |
| 2018/0182618 A1 | 6/2018 | Blanquart et al. |
| 2018/0222933 A1 | 8/2018 | Romero |
| 2018/0233350 A1 | 8/2018 | Tois et al. |
| 2018/0243787 A1 | 8/2018 | Haukka et al. |
| 2019/0017170 A1 | 1/2019 | Sharma et al. |
| 2019/0057858 A1 | 2/2019 | Hausmann et al. |
| 2019/0074441 A1 | 3/2019 | Kikuchi et al. |
| 2019/0100837 A1 | 4/2019 | Haukka et al. |
| 2019/0155159 A1 | 5/2019 | Knaepen et al. |
| 2019/0283077 A1 | 9/2019 | Pore et al. |
| 2019/0333761 A1 | 10/2019 | Tois et al. |
| 2019/0341245 A1 | 11/2019 | Tois et al. |
| 2020/0051829 A1 | 2/2020 | Tois et al. |
| 2020/0105515 A1 | 4/2020 | Maes et al. |

FOREIGN PATENT DOCUMENTS

| | | |
|---|---|---|
| EP | 1340269 | 2/2009 |
| EP | 3026055 | 6/2016 |
| JP | 2001127068 | 5/2001 |
| JP | 2008311603 | 12/2008 |
| JP | 4333900 | 9/2009 |
| JP | 2011018742 | 1/2011 |
| JP | 2011-187583 | 9/2011 |
| JP | 2014-93331 | 5/2014 |
| KR | 102001001072 | 2/2001 |
| KR | 1020020010821 | 2/2002 |
| KR | 20030027392 | 4/2003 |
| KR | 1020040056026 | 6/2004 |
| KR | 1020050103811 | 11/2005 |
| KR | 10-0869326 | 11/2008 |
| KR | 10-0920033 | 10/2009 |
| KR | 10-2012-0120902 | 11/2012 |
| TW | 175767 | 8/2003 |
| TW | 2005-39321 | 12/2005 |
| TW | 2010-05827 | 2/2010 |
| TW | 2014-39365 | 10/2014 |
| WO | WO 2002/045167 | 6/2002 |
| WO | WO 2011/156705 | 12/2011 |
| WO | WO 2013/161772 | 10/2013 |
| WO | WO 2014/156782 | 10/2014 |
| WO | WO 2014209390 A1 | 12/2014 |
| WO | WO 2015/047345 | 4/2015 |
| WO | WO 2015094305 A1 | 6/2015 |
| WO | WO 2015147843 A1 | 10/2015 |
| WO | WO 2015147858 A1 | 10/2015 |
| WO | WO 2016/178978 | 11/2016 |
| WO | WO 2017/184357 | 10/2017 |
| WO | WO 2017/184358 | 10/2017 |
| WO | WO 2018/204709 | 11/2018 |
| WO | WO 2018/213018 | 11/2018 |

OTHER PUBLICATIONS

Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.

Burton, B.B. et al., "Atomic Layer Deposition of MgO Using Bis(ethylcyclopentadienyl)magnesium and H2O". J. Phys. Chem. C, 2009, 113, 1939-1946.

Burton, B.B., et al., "SiO2 Atomic Layer Deposition Using Tris(dimethylamino)silane and Hydrogen Peroxide Studied by in Situ Transmission FTIR Spectroscopy". J. Phys. Chem. C, 2009, 113, 8249-8257.

Carlsson, J., "Precursor Design for Chemical Vapour Deposition", Acta Chemica Scandinavica, vol. 45, 1991, pp. 864-869.

Chang et al, "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.

Chen et al., Highly Stable Monolayer Resists for Atomic Layer Deposition on Germanium and Silicon, Chem. Matter, vol. 18, No. 16, pp. 3733-3741, 2006.

Coclite, et al.; 25th Anniversary Article: CVD Polymers: A New Paradigm for Surface Modification and Device Fabrication; Advanced Materials; Oct. 2013; 25; pp. 5392-5423.

Elam et al., "Kinetics of the WF6 and Si2H6 surface reactions during tungsten atomic layer deposition", Surface Science, vol. 479, 2001, pp. 121-135.

Elam et al., "Nucleation and growth during tungsten atomic layer deposition on SiO2 surfaces", Thin Solid Films, vol. 386, 2001 pp. 41-52.

Fabreguette et al., Quartz crystal microbalance study of tungsten atomic layer deposition using WF6 and Si2H6, Thin Solid Films, vol. 488, 2005, pp. 103-110.

Farm et al. Selective-Area Atomic Layer Deposition Using Poly( methyl methacrylate) Films as Mask Layers, J. Phys. Chem. C, 2008, 112, pp. 15791-15795. (Year: 2008).

Farr, Isaac Vincent; Synthesis and Characterization of Novel Polyimide Gas Separation Membrane Material Systems, Chapter 2; Virginia Tech Chemistry PhD Dissertation; URN# etd-080999-123034; Jul. 26, 1999.

George, Steven M.; Atomic Layer Deposition: An Overview; Chem. Rev. 2010, 110, pp. 111-131; Steven M.; Atomic Layer Deposition: An Overview; Chem. Rev. 2010, 110, pp. 111-131; Feb. 12, 2009.

Ghosal et al., Controlling Atomic Layer Deposition of TiO2 in Aerogels through Surface Functionalization, Chem. Matter, vol. 21, pp. 1989-1992, 2009.

Grubbs et al., "Nucleation and growth during the atomic layer deposition of W on Al2O3 and Al2O3 on W", Thin Solid Films, vol. 467, 2004, pp. 16-27.

Hymes et al., "Surface cleaning of copper by thermal and plasma treatment in reducing and inert ambients", J. Vac. Sci. Technol. B, vol. 16, No. 3, May/Jun. 1998, pp. 1107-1109.

Klaus et al., "Atomic layer deposition of tungsten using sequential surface chemistry with a sacrificial stripping reaction", Thin Solid Films, vol. 360, 2000, pp. 145-153.

Klaus et al., "Atomically controlled growth of tungsten and tungsten nitride using sequential surface reactions", Applied Surface Science 162-163, 2000, pp. 479-491.

King, Dielectric Barrier, Etch Stop, and Metal Capping Materials for State of the Art and beyond Metal Interconnects, ECS Journal of Solid State Science and Technology, vol. 4, Issue 1, pp. N3029-N3047, 2015.

Lee et al., Area-Selective Atomic Layer Deposition Using Self-Assembled Monolayer and Scanning Probe Lithography, Journal of the Electrochemical Society, vol. 156, Issue 9, pp. G125-G128, 2009.

Lei et al., "Real-time observation and opitimization of tungsten atomic layer deposition process cycle", J. Vac. Sci. Technol. B, vol. 24, No. 2, Mar./Apr. 2006, pp. 780-789.

Lemonds, Andrew Michael, "Atomic Layer Deposition and Properties of Refractory Transition Metal-Based Copper-Diffusion Barriers for Ulsi Interconnect", The University of Texas at Austin, 2003, pp. 1-197.

Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.

Liang, Xuehai, et al., "Growth of Ge Nanofilms Using Electrochemical Atomic Layer Deposition, with a "Bait and Switch" Surface-Limited Reaction". Journal of the American Chemical Society, 2011, 133, 8199-8024.

(56) References Cited

OTHER PUBLICATIONS

Lohokare et al., "Reactions of Disilane on Cu(111): Direct Observation of Competitive Dissociation, Disproportionation, and Thin Film Growth Processes", Langmuir 1995, vol. 11, pp. 3902-3912.
Low et al., Selective deposition of CVD iron on silicon dioxide and tungsten, Microelectronic Engineering 83, pp. 2229-2233, 2006.
Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.
Mackus et al., Local deposition of high-purity Pt nanostructures by combining electron beam induced deposition and atomic layer deposition, Journal of Applied Physics, vol. 107, pp. 116102-1 116102-3, 2010.
Maluf et al., "Selective tungsten filling of sub-0.25µm trenches for the fabrication of scaled contacts and x-ray masks", J. Vac. Sci. Technol. B, vol. 8, No. 3, May/Jun. 1990, pp. 568-569.
Norrman, et al.; 6 Studies of Spin-Coated Polymer Films; Annu. Rep. Prag. Chem.; Sect. C; 2005; 101; pp. 174-201.
Overhage et al., Selective Atomic Layer Deposition (SALD) of Titanium Dioxide on Silicon and Copper Patterned Substrates, Journal of Undergraduate Research 4, Mar. 29, 2011 in 4 pages.
Parulekar et al., Atomic Layer Deposition of Zirconium Oxide on Copper Patterned Silicon Substrate, Journal of Undergraduate Research, vol. 7, pp. 15-17, 2014.
Parulekar et al., Selective atomic layer deposition of zirconium oxide on copper patterned silicon substrate, pp. 1-6, 2013.
Prasittichai et al., "Area Selective Molecular Layer Deposition of Polyurea Film", Applied Materials & Interfaces, 2013, vol. 5, pp. 13391-13396.
Proslier et al., "Atomic Layer Deposition and Superconducting Properties of NbSi Films", The Journal of Physical Chemistry C, 2011, vol. 115, No. 50, pp. 1-26.
Putkonen, et al.; Atomic Layer Deposition of Polyimide Thin Films; Journal of Materials Chemistry; 2007, 17, pp. 664-669.
Ratta, Varun; Crystallization, Morphology, Thermal Stability and Adhesive Properties of Novel High Performance Semicrystalline Polyimides, Chapter 1; Virginia Tech Chemistry PhD Dissertation; URN # etd-051799-162256; Apr. 26, 1999.
Roberts et al., "Selective Mn deposition on Cu lines", poster presentation, 12th International Conference on Atomic Layer Deposition, Jun. 19, 2012, Dresden, Germany.
Sapp, et al.; Thermo-Mechanical and Electrical Characterization of Through-Silicon Vias with a Vapor Deposited Polyimide Dielectric Liner; IEEE; 2012.
Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601-1-010601-4, Jan. 2014.
Senesky et al., "Aluminum nitride as a masking material for the plasma etching of silicon carbide structures," 2010, IEEE, pp. 352-355.
Sundberg, et al.; Organic and Inorganic-Organic Thin Film Structures by Molecular Layer Deposition: A Review; Beilstein J. Nanotechnol; 2014, 5, pp. 1104-1136.
Toirov, et al.; Thermal Cyclodehydration of Polyamic Acid Initiated by UV-Irradiation; Iranian Polymer Journal; vol. 5, No. 1; pp. 16-22; 1996; Iran.
"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.
Vallat et al., Selective deposition of Ta2O5 by adding plasma etching super-cycles in plasma enhanced atomic layer deposition steps, Journal of Vacuum Science & Technology A, vol. 35, No. 1, pp. 01B104-1-01B104-7, Jan. 2017.
Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.

Zhou, et al.; Fabrication of Organic Interfacial Layers by Molecular Layer Deposition: Present Status and Future Opportunities; Journal of Vacuum Science & Technology; A 31 (4), 040801-1 to 040801-18; 2013.
International Search Report and Written Opinion dated Feb. 17, 2012 in Application No. PCT/US2011/039970, filed Jun. 10, 2011.
Notice of Allowance dated Apr. 5, 2017 in U.S. Appl. No. 15/177,195.
Office Action dated Aug. 29, 2014 in U.S. Appl. No. 13/702,992.
Office Action dated Nov. 7, 2014 in U.S. Appl. No. 13/708,863.
File History of U.S. Appl. No. 15/177,195, filed Jun. 8, 2016.
File History of U.S. Appl. No. 13/702,992, filed Mar. 26, 2013.
File History of U.S. Appl. No. 13/708,863, filed Dec. 7, 2012.
Vervuurt et al., "Area-selective atomic layer deposition of platinum using photosensitive polyimide", Nanotechnology 27, 2016, in 6 pages.
Bernal-Ramos, et al., "Atomic Layer Deposition of Cobalt Silicide Thin Films Studied by in Situ Infrared Spectroscopy", Chem. Mater. 2015, 27, pp. 4943-4949.
Lemonds, A.M., "Atomic layer deposition of TaSix thin films on $SiO_2$ using $TaF_5$ and $Si_2H_6$", Thin Solid Films, 488, 2005 pp. 9-14.
Ellinger et al., "Selective Area Spatial Atomic Layer Deposition of ZnO, $Al_2O_3$, and Aluminum-Doped ZnO Using Poly(vinyl pyrrolidone)", Chem. Mater. 2014, 26, pp. 1514-1522.
Aaltonen et al., "Atomic Layer Deposition of Iridium Thin Films", Journal of the Electrochemical Society, 151 (8) G489-G492 (2004).
Benzotriazole, Wikipedia via https://en.wikipedia.org/wiki/Benzotriazole; pp. 1-5, no date available.
Cho et al., "Atomic layer deposition of $Al_2O_3$ thin films using dimethylaluminum isopropoxide and water", Journal of Vacuum Science & Technology A 21, (2003), doi: 10.1116/1.1562184, pp. 1366-1370.
Farm et al., "Self-Assembled Octadecyltrimethoxysilane Monolayers Enabling Selective-Area Atomic Layer Deposition of Iridium", Chem. Vap. Deposition, 2006, 12, pp. 415-417.
File History of U.S. Appl. No. 14/612,784, filed Feb. 3, 2015.
File History of U.S. Appl. No. 15/877,632, filed Jan. 23, 2018.
File History of U.S. Appl. No. 16/657,307, filed Oct. 18, 2019.
File History of U.S. Appl. No. 14/687833, filed Apr. 15, 2015.
File History of U.S. Appl. No. 16/100,855, filed Aug. 10, 2018.
File History of U.S. Appl. No. 16/594,365, filed Oct. 7, 2019.
File History of U.S. Appl. No. 14/628,799, filed Feb. 23, 2015.
File History of U.S. Appl. No. 15/331,366, filed Oct. 21, 2016.
File History of U.S. Appl. No. 16/143,888, filed Sep. 27, 2018.
File History of U.S. Appl. No. 16/987,990, filed Aug. 7, 2020.
File History of U.S. Appl. No. 14/817,161, filed Aug. 3, 2015.
File History of U.S. Appl. No. 14/819,274, filed Aug. 5, 2015.
File History of U.S. Appl. No. 16/787,672, filed Feb. 11, 2020.
File History of U.S. Appl. No. 15/432,263, filed Feb. 14, 2017.
File History of U.S. Appl. No. 16/158,780, filed Oct. 12, 2018.
File History of U.S. Appl. No. 16/773,064, filed Jan. 27, 2020.
File History of U.S. Appl. No. 15/221,453, filed Jul. 27, 2016.
File History of U.S. Appl. No. 16/575,112, filed Sep. 18, 2019.
File History of U.S. Appl. No. 15/795,768, filed Oct. 27, 2017.
File History of U.S. Appl. No. 16/040,844, filed Jul. 20, 2018.
File History of U.S. Appl. No. 16/676,017, filed Nov. 6, 2019.
File History of U.S. Appl. No. 15/364,024, filed Nov. 29, 2016.
File History of U.S. Appl. No. 15/892,728, filed Feb. 9, 2018.
File History of U.S. Appl. No. 16/605,475, filed Oct. 15, 2019.
File History of U.S. Appl. No. 16/033,952, filed Jul. 12, 2018.
File History of U.S. Appl. No. 17/135,001, filed Dec. 28, 2020.
File History of U.S. Appl. No. 16/399,328, filed Apr. 30, 2019.
File History of U.S. Appl. No. 17/113,383, filed Dec. 7, 2020.
File History of U.S. Appl. No. 15/971,601, filed May 4, 2018.
File History of U.S. Appl. No. 16/588,600, filed Sep. 30, 2019.
File History of U.S. Appl. No. 16/836,151, filed Mar. 31, 2020.
File History of U.S. Appl. No. 17/064,865, filed Oct. 7, 2020.
File History of U.S. Appl. No. 14/737,293, filed Jun. 11, 2015.
File History of U.S. Appl. No. 15/356,306, filed Nov. 18, 2016.
File History of U.S. Appl. No. 16/213,479, filed Dec. 7, 2018.
File History of U.S. Appl. No. 14/613,183, filed Feb. 3, 2015.
File History of U.S. Appl. No. 14/988,374, filed Jan. 5, 2016.
File History of U.S. Appl. No. 15/609,497, filed May 31, 2017.
File History of U.S. Appl. No. 16/100,581, filed Aug. 10, 2018.

(56) References Cited

OTHER PUBLICATIONS

Formic Acid, Wikipedia via https://en.wikipedia.org/wiki/Formic_acid; pp. 1-5, no date available.
Hashemi et al., "A New Resist for Area Selective Atomic and Molecular Layer Deposition on Metal-Dielectric Patterns", J. Phys. Chem. C 2014, 118, pp. 10957-10962.
Hashemi et al., "Selective Deposition of Dieletrics: Limits and Advantages of Alkanethiol Blocking Agents on Metal-Dielectric Patterns", ACS Appl. Mater. Interfaces 2016, 8, pp. 33264-33272.
Hu et al. "Coating strategies for atomic layer deposition", Nanotechnol. Rev. 2017; 6(6): pp. 527-547.
International Search Report and Written Opinion dated Aug. 8, 2018 in Application No. PCT/US2018/030974, filed May 3, 2018.
International Search Report and Written Opinion dated Jul. 24, 2018 in Application No. PCT/US2018/030979, filed May 3, 2018.
Kukli et al., "Properties of hafnium oxide films grown by atomic layer deposition from hafnium tetraiodide and oxygen", J. Appl. Phys., vol. 92, No. 10, Nov. 15, 2002, pp. 5698-5703.
Lecordier et al., "Vapor-deposited octadecanethlol masking layer on copper to enable area selective Hf3N4 atomic layer deposition on dielectrics studied by in situ spectroscopic ellipsometry", J. Vac. Sci. Technol. A36(3), May/Jun. 2018, pp. 031605-1-031605-8.
Lin et al., "Selective Deposition of Multiple Sensing Materials on Si Nanobelt Devices through Plasma-Enhanced Chemical Vapor Deposition and Device-Localized Joule Heating", ACS Appl. Mater. Interfaces 2017, 9, 39935-39939, DOI: 10.1021/acsami.7b13896.
Mackus et al., "The use of atomic layer deposition in advanced nanopatterning", Nanoscale, 2014, 6, pp. 10941-10960.
Office Action dated Jun. 8, 2017 in Korean Application No. 2013-7000596.
Schmeiβer, Decomposition of formic acid, Chemnitz University of Technology, pp. 1-13, Aug. 31, 2011.
Schmeiβer, Reduction of Copper Oxide by Formic Acid an ab-initio study, Chemnitz University of Technology, pp. 1-42, Sep. 2011.
Schuiskly et al., "Atomic Layer Deposition of Thin Films Using 02 as Oxygen Source", Langmuir, vol. 17, No. 18, 2001, pp. 5508-5512.
Suntola, Tuomo, "Thin Films and Epitaxy Part B: Grown mechanism and Dynamics", Handbook of Crystal Growth vol. 3, Elsevier, 1994, 33 pages.
Ting, et al., "Selective Electroless Metal Deposition for Integrated Circuit Fabrication", J. Electrochem. Soc., vol. 136, No. 2, Feb. 1989, pp. 456-462.
Wang et al., "Low-temperature plasma-enhanced atomic layer deposition of tin oxide electron selective layers for highly efficient planar perovskite solar cells", Journal of Materials Chemistry A, 2016, 4, pp. 12080-12087.

\* cited by examiner

SELECTIVE DEPOSITION USING HYDROPHOBIC PRECURSORS

REFERENCE TO RELATED APPLICATIONS

The present application claims priority to U.S. Application No. 62/332,396, filed May 5, 2016, the disclosure of which is incorporated by reference.

BACKGROUND

Field of the Invention

The present disclosure relates generally to the field of semiconductor device manufacturing and, more particularly, to selective deposition of a material on a first surface of a substrate relative to a second organic surface.

Description of the Related Art

The shrinking device dimensions in semiconductor manufacturing call for new innovative processing approaches. One of these considered is selective deposition, which has gained increasing interest among semiconductor manufacturers today. Selective deposition would be highly beneficial in various ways. For instance, selective deposition could allow for a decrease in lithography and etch steps, thereby reducing the cost of processing. Selective deposition could also enable enhanced scaling in narrow structures, making bottom-up fill possible.

Most of the ALD oxides are deposited using $H_2O$, $H_2O_2$ or $O_3$ or $O_2$ plasma. $O_3$ and $O_2$ plasma are typically not preferred for deposition where the substrate comprises organic surfaces, since they may destroy or burn off the organic material during deposition. Therefore, $H_2O$ is typically used in such circumstances. However, $H_2O$ can be problematic since it is difficult to completely remove from the reaction chamber during deposition. This accumulated water may cause CVD growth and can lead to loss of selectivity in selective ALD processes. Further, if $H_2O$ molecules are able to penetrate between the long carbon chains of a self-assembled monolayer (SAM) or inside another organic material, such as polymer material, it is possible that these $H_2O$ molecules will be present when a metal precursor is provided and thus undesired CVD growth may occur. Increasing the purge time to address these issues would increase the overall processing time significantly and at the same time would decrease the throughput.

SUMMARY OF THE INVENTION

According to one aspect, vapor deposition processes are provided in which a material is selectively deposited on a first surface of a substrate relative to a second organic surface. In some embodiments the methods comprise contacting the substrate with a first vapor phase hydrophobic reactant and a second vapor phase reactant such that the material is deposited selectively on the first surface relative to the second organic surface. In some embodiments the first surface is not an organic surface and does not comprise any organic material. The first surface may be, for example, a metal surface, a semi-metal surface, an oxidized metal surface or an oxidized semi-metal surface. In some embodiments the first surface may be a metal oxide, metal carbide, metal nitride, metal silicide or metal silicate surface. In some embodiments the first surface is a dielectric surface.

The second organic surface may comprise, for example, a self-assembled monolayer or a directed self-assembled layer. In some embodiments the second organic surface comprises a polymer, such as a polyimide, polyamide, polyuria or polystyrene.

The material that is deposited may be a metal or metallic material. In some embodiments the material is a metal oxide, such as $ZrO_2$ or $HfO_2$. In some embodiments the material is a metal nitride.

In some methods, a metal oxide is deposited on a first surface of a substrate relative to a second surface by a process comprising contacting the substrate with a first hydrophobic reactant comprising metal and a second reactant. The first substrate surface may comprise, for example, a metal or semi-metal containing material and the second substrate surface may comprise an organic material.

In some embodiments the first hydrophobic reactant comprises a metal. The first hydrophobic reactant may comprise at least one hydrophobic hydrocarbon ligand. For example, it may comprise one or more alkyl, alkenyl, cyclic C3-C8 or aromatic groups. In some embodiments the hydrophobic reactant may comprise one or two hydrophilic ligands, such alkylamine, alkoxide or halide ligands.

In some embodiments the first hydrophobic metal reactant has the formula $L_nMX_y$, in which:
 n is from 1 to 6;
 y is from 0 to 2;
 L is a hydrophobic ligand;
 X is a hydrophilic ligand; and
 M is a metal.

In some embodiments M is selected from Hf, Zr, Ta and Nb. L may be, for example, Cp or a C1-C4 alkyl.

In some embodiments the first reactant is bis(methylcyclopentadienyl) methoxymethyl zirconium (IV). In some embodiments the first reactant is bis(methylcyclopentadienyl) methoxymethyl hafnium (IV). In some embodiments $ZrO_2$ is selectively deposited on a first surface relative to a second organic surface, the first reactant is bis(methylcyclopentadienyl) methoxymethyl zirconium (IV) and the second reactant is $H_2O$. In some embodiments $HfO_2$ is selectively deposited on a first surface relative to a second organic surface, the first reactant is bis(methylcyclopentadienyl) methoxymethyl hafnium (IV) and the second reactant is $H_2O$.

In some embodiments the second reactant comprises oxygen or nitrogen. For example, the second reactant may comprise $H_2O$, $O_3$, $H_2O_2$, oxygen plasma, oxygen ions, oxygen radicals or other excited species of oxygen. In some embodiments the second reactant may comprise $NH_3$, $N_2H_4$, nitrogen plasma, nitrogen ions, nitrogen radicals or other excited nitrogen species. In some embodiments the second reactant comprises hydrogen.

In some embodiments the vapor deposition process may be a chemical vapor deposition process, such as a cyclic CVD process. In some embodiments the vapor deposition process may be an atomic layer deposition process. In some embodiments the substrate is alternately and sequentially contacted with the first and second reactants.

In some embodiments the material is deposited on the first surface relative to the second surface with a selectivity of greater than about 50%, greater than about 60%, greater than about 70%, greater than about 80%, greater than about 90% or greater than about 95%.

BRIEF DESCRIPTION OF THE DRAWINGS

FIG. 2A shows the lack of $ZrO_2$ on the SAM surface following deposition by ALD from bis(methylcyclopentadienyl)methoxymethyl zirconium (IV) and $H_2O$, while

DETAILED DESCRIPTION

In one aspect of the present disclosure, materials can be selectively deposited by a vapor deposition process on a first surface of a substrate relative to a second organic surface of a substrate. In some embodiments a metal oxide, such as $ZrO_2$, is selectively deposited on a first surface relative to a second organic surface of a substrate. In some embodiments the deposition process is a vapor deposition process that utilizes at least one hydrophobic metal reactant. In some embodiments cyclical vapor deposition is used, such as cyclical CVD or atomic layer deposition (ALD) processes. For example, the vapor deposition process may be an atomic layer deposition (ALD) process that utilizes at least one hydrophobic metal reactant to selectively deposit a material such as a metal oxide on a first surface of a substrate relative to a second, organic surface. After selective deposition of the selected material is completed, further processing can be carried out to form the desired structures.

The first surface on which deposition is desired, may be, for example, a metal, semi-metal or dielectric surface. The second organic surface, on which deposition is not desired, may comprise, for instance, a polymer such as polyimide and polystyrene, amorphous carbon, photoresist material or graphene. In some embodiments the organic surface can comprise a self-assembled monolayer (SAM). In some embodiments deposition on the second organic surface is diminished relative to the first surface through use of a hydrophobic precursor in the vapor phase deposition process.

In some embodiments, a selective ALD process comprises alternately and sequentially contacting a substrate comprising a first surface and a second organic surface with a first hydrophobic reactant, such as a hydrophobic metal reactant, and a second reactant. In some embodiments a metal oxide is deposited by an ALD process in which the substrate is alternately and sequentially contacted with a hydrophobic metal reactant and a second reactant comprising oxygen, such as water.

In some embodiments, a selective CVD process comprises contacting a substrate comprising a first surface and a second organic surface with a first hydrophobic reactant, such as a hydrophobic metal reactant, and a second reactant. In some embodiments a metal oxide is deposited by a CVD process in which the substrate is contacted with a hydrophobic metal reactant and a second reactant comprising oxygen, such as water. In some embodiments the CVD process may comprise sequentially contacting the substrate with the first and second reactants. In some embodiments a selective CVD reaction is initiated by the first surface and not by the second organic surface, leading to selective deposition on the first surface relative to the second organic surface.

Substrate Surfaces

As mentioned above, a vapor deposition process is utilized to selectively deposit a material on a first substrate surface relative to a second, organic surface, such as surface comprising an organic film.

In some embodiments, the first surface on which a material is selectively deposited comprises a metal or semimetal. In some embodiments the first surface may comprise a metallic material. In some embodiments the first surface comprises Co, W or Ru.

In some embodiments the first surface may comprise an oxidized metal, semimetal or metallic material. For example, the first surface may comprise a metal or metallic material that has been oxidized on its surface, for example, Co, W or Ru. In some embodiments the first surface does not comprise an organic material.

In some embodiments the first surface may comprise a dielectric material or electrically insulating material, such as a dielectric metal or transition metal oxide, like $Al_2O_3$ or $TiO_2$.

In some embodiments the first surface may comprise silicon and/or germanium. For example, the first surface may comprise silicon nitride, silicon oxide, silicon carbide, or germanium oxide.

In some embodiments the first surface may comprise an oxide, nitride, carbide, or silicate.

In some embodiments the first surface may comprise a mixture of two or more of the materials recited above.

The second surface comprises an organic material. In some embodiments the second surface comprises a self-assembled monolayer (SAM). For example, the second surface may comprise a trichloro(octadecyl)silane SAM.

In some embodiments the second organic surface comprises a polymer, such as a polymer film. For example, the second organic surface may comprise a polyimide, polyamide, polyuria, polystyrene, polyurethane, polythioureas, polyesters, polyimines, polythiophene or other such polymer. In some embodiments the polymers may include dimers or trimers. In some embodiments the organic surface may comprise other polymeric forms or mixtures of the above materials.

In some embodiments the second organic surface comprises a directed self-assembled layer (DSA), such as a block co-polymer layer.

In some embodiments the second organic surface comprises graphene or another form of carbon. In some embodiments the second organic surface comprises amorphous carbon. The amorphous carbon may contain hydrogen.

In some embodiments the second organic surface comprises photoresist material.

In some embodiments the second organic material does not comprise hydrocarbon contamination of a substrate surface, for example hydrocarbon contamination from the atmosphere.

In some embodiments, such as, but not limited to the case of SAM layers, the contact angle of the organic surface is 95 or greater, 100 or greater, 105 or greater, 107 or greater, 109 or greater, 110 or greater, 111 or greater, 112 or greater, or 113 or greater. In some embodiments. In some embodiments, such as, but not limited, in the case of a polymer layer, such as a polyimide layer, the contact angle of the organic surface is 40 or greater, 60 or greater, 70 or greater, 80 or greater, 85 or greater or 90 or greater. In some embodiments the contact angle is less than 180 or less than 120, for example from 40 to 120, 60 to 120, 70 to 120, 80 to 120, 90 to 120, 95 to 120, 100 to 120, 105 to 120, 107 to 120, 109 to 120, 110 to 120, 111 to 120, 112 to 120, 113 to 120 etc.

In some embodiments the organic surface is not significantly changed by the selective deposition process. For example, in some embodiments the composition is not significantly changed. In some embodiments the contact angle is not significantly changed by the selective deposition process.

Selectivity

As mentioned above, in some embodiments a material is selectively deposited on a first substrate surface relative to a different, second organic surface. Selectivity can be given as a percentage calculated by [(deposition on first surface)−(deposition on second organic surface)]/(deposition on the first surface). Deposition can be measured in any of a variety of ways. In some embodiments deposition may be given as the measured thickness of the deposited material. In some embodiments deposition may be given as the measured amount of material deposited.

In some embodiments selectivity is greater than about 10%, greater than about 50%, greater than about 75%, greater than about 85%, greater than about 90%, greater than about 93%, greater than about 95%, greater than about 98%, greater than about 99% or even greater than about 99.5%. In embodiments described herein, the selectivity can change over the duration or thickness of a deposition.

In some embodiments deposition on the first surface of the substrate relative to the second organic surface of the substrate is at least about 80% selective, which may be selective enough for some particular applications. In some embodiments the deposition on the first surface of the substrate relative to the second organic surface of the substrate is at least about 50% selective, which may be selective enough for some particular applications. In some embodiments the deposition on the first surface of the substrate relative to the second organic surface of the substrate is at least about 10% selective, which may be selective enough for some particular applications.

In some embodiments deposition only occurs on the first surface, such as a metallic or dielectric surface, and does not occur on the second organic surface.

Deposition

In some embodiments a material, such as a metal oxide, is selectively deposited on the first surface relative to the second organic surface by a vapor deposition process in which the substrate is contacted with two or more vapor phase reactants. In some embodiments the reactants include a first hydrophobic reactant and a second reactant. The first hydrophobic reactant and second reactant can be selected to deposit the desired material. Additional reactants (third reactant, fourth reactant etc . . . ) can be utilized in some embodiments, for example to contribute additional components to the material that is deposited.

In some embodiments the first surface is substantially reactive to one or more of the vapor phase reactants, while the second organic surface is not substantially reactive.

In some embodiments the material that is selectively deposited comprises a metal and the first hydrophobic reactant comprises a metal that is included in the deposited material. In some embodiments the material that is selectively deposited is a metal oxide and the first hydrophobic reactant comprises a metal that is included in the metal oxide and the second reactant comprises oxygen. In some embodiments $Zr_2O$ is selectively deposited by contacting a substrate with a first hydrophobic reactant comprising zirconium and a second reactant comprising oxygen.

In some embodiments the material that is selectively deposited is a metal nitride and the first hydrophobic reactant comprises a metal that is included in the metal nitride and the second reactant comprises nitrogen.

In some embodiments the material that is selectively deposited is a metal or metallic film comprising sulfur, carbon, silicon and or hydrogen. In some embodiments the material is a sulphide. In some embodiments the material is a silicide. In some embodiments the material is an elemental metal. Again, the first hydrophobic reactant may comprise a metal that is included in the deposited material.

Although referred to as the first hydrophobic reactant, second reactant etc . . . , in particular embodiments the reactants may be provided in a different order, or together.

In some embodiments the vapor deposition process is an ALD-type process. In some embodiments the deposition process may be a vapor deposition process in which at least one of the reactants is at least partially decomposed, such as selectively decomposed on the first surface. For example, in some embodiments the vapor deposition process may be a chemical vapor deposition (CVD) process, such as a sequential or cyclic CVD process or a single source CVD process.

In some embodiments the substrate on which deposition is desired, such as a semiconductor workpiece, is loaded into a reaction space or reactor. Various types of reactors can be used, depending on the particular circumstances. These include, for example, flow-type reactors, cross-flow reactors, shower head-type reactors and space divided reactors. In some embodiments a high-volume manufacturing-capable single wafer reactor is used. In other embodiments a batch reactor that is able to process multiple substrates is used. For embodiments in which batch reactors are used, the number of substrates may be, for example, in the range of 10 to 200, in the range of 50 to 150, or in the range of 100 to 130. The reactor may be part of a cluster tool in which a variety of different processes in the formation of an integrated circuit are carried out.

Examples of suitable reactors that may be used include commercially available equipment such as the F-120® reactor, F-450® reactor, Pulsar® reactors—such as the Pulsar® 2000 and the Pulsar® 3000—EmerALD® reactor and Advance® 400 Series reactors, available from ASM America, Inc. of Phoenix, Ariz. and ASM Europe B.V., Almere, Netherlands. Other commercially available reactors include those from ASM Japan K.K (Tokyo, Japan) under the tradename Eagle® XP and XP8.

In some embodiments an ALD process comprises alternately and sequentially contacting a substrate comprising a first surface and a second organic surface with a first hydrophobic reactant and a second reactant. ALD-type processes are based on controlled, generally self-limiting surface reactions. Gas phase reactions are typically avoided by contacting the substrate alternately and sequentially with the reactants. Vapor phase reactants are separated from each other in the reaction chamber, for example, by removing excess reactants and/or reactant byproducts between reactant pulses. The reactants may be removed from proximity with the substrate surface with the aid of a purge gas and/or vacuum. In some embodiments excess reactants and/or reactant byproducts are removed from the reaction space by purging, for example with an inert gas.

Briefly, a substrate comprising at least a first surface and second, different organic surface is heated to a suitable deposition temperature, generally at lowered pressure. Deposition temperatures are generally maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved. Here, the temperature varies depending on the precursors being used and is may be, for example, at or below about 500° C., between about 80° C. and about 300° C. In some embodiments the temperature may be at or below about 600° C., at or below about 500° C., at or below about 400° C., at or below about 350° C., at or below about 300° C., at or below about 250° C., at or below about 200° C., at or below about 150° C., at or below about 100° C., at or below about 50° C. or at or below about 25° C. In some such embodiments the temperature may be above 0° C., above 1° C., above 5° C., above 10° C. or above 20° C. In some embodiments the temperature is above the condensation point of one or more of the reactants. In some embodiments the temperature is below the decomposition temperature of the organic surface and/or the temperature at which the organic surface remains stable.

In some embodiments the reaction chamber pressure may be from about 1 mTorr to about 1000 Torr.

The substrate is contacted with a vapor phase first hydrophobic reactant. In some embodiments a pulse of vapor phase first hydrophobic reactant is provided to a reaction space containing the substrate comprising a first surface and a second organic surface. In some embodiments the substrate itself is moved to a reaction space containing vapor phase first reactant. Conditions are preferably selected such that no more than about one monolayer of the first hydrophobic reactant is adsorbed on the substrate surface in a self-limiting manner. The appropriate contacting times can be readily determined by the skilled artisan based on the particular circumstances. Excess first reactant and reaction byproducts, if any, are removed from the substrate surface, such as by purging with an inert gas or by removing the substrate from the presence of the first reactant.

Purging means that vapor phase precursors and/or vapor phase byproducts are removed from the substrate surface such as by evacuating a chamber with a vacuum pump and/or by replacing the gas inside the reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as where highly conformal step coverage over extremely high aspect ratio structures or other structures with complex surface morphology is needed or when high throughput is desired and obtained.

After removing the first reactant, the substrate is contacted with a vapor phase second reactant. In some embodiments a pulse of a second gaseous reactant is provided to a reaction space containing the substrate. In some embodiments the substrate is moved to a reaction space containing the vapor phase second reactant. The second reactant reacts with the adsorbed first reactant to selectively deposit the desired material on the first surface relative to the second organic surface.

Excess second reactant and gaseous byproducts of the surface reaction, if any, are subsequently removed from the substrate surface.

The steps of contacting and removing are repeated until a thin film of the desired thickness has been selectively formed on the first surface of substrate relative to the second organic surface, with each cycle typically leaving no more than about a molecular monolayer. Additional phases comprising alternately and sequentially contacting the surface of a substrate with other reactants can be included to form more complicated materials, such as ternary materials.

As mentioned above, each phase of each cycle is typically self-limiting. An excess of reactant precursors is supplied for each phase to saturate the susceptible reaction sites on the first surface which can be, for example, $MO_2$ with M-OH groups. Surface saturation ensures reactant occupation of all available reactive sites (subject, for example, to physical size or "steric hindrance" restraints) and thus ensures excellent step coverage and/or uniform distribution of adsorbed precursor molecules. Typically, less than one molecular layer of material is deposited on the first surface with each cycle, however, in some embodiments more than one molecular layer may be deposited during the cycle. Reasonable surface saturation is understood to be enough, for example, for optimizing the throughput.

Removing excess reactants can include evacuating some of the contents of a reaction space and/or purging a reaction space with helium, nitrogen or another inert gas. In some embodiments purging can comprise turning off the flow of the reactive gas while continuing to flow an inert carrier gas to the reaction space.

The precursors employed in the ALD type processes may be solid, liquid or gaseous materials under standard conditions (room temperature and atmospheric pressure), provided that the precursors are in vapor phase before they are contacted with the substrate surface. Contacting a substrate surface with a vaporized precursor means that the precursor vapor is in contact with the substrate surface for a limited period of time. Typically, the contacting time is from about 0.05 to 10 seconds. However, depending on the substrate type and its surface area, the contacting time may be even higher than 10 seconds. Contacting times can be on the order of minutes in some cases. The optimum contacting time can be determined by the skilled artisan based on the particular circumstances.

The mass flow rate of the precursors can also be determined by the skilled artisan. In some embodiments the flow rate of metal precursors is preferably between about 1 and 1000 sccm without limitation, more preferably between about 100 and 500 sccm.

The pressure in a reaction chamber is typically from about 0.01 to about 20 mbar, more preferably from about 1 to about 10 mbar. However, in some cases the pressure will be higher or lower than this range, as can be determined by the skilled artisan given the particular circumstances.

Before starting the deposition, the substrate is typically heated to a suitable growth temperature. The preferred deposition temperature may vary depending on a number of factors such as, and without limitation, the reactant precursors, the pressure, flow rate, the arrangement of the reactor, stability of the organic surface, crystallization temperature of the deposited thin film, and the composition of the substrate including the nature of the material to be deposited on and the nature of the organic surface. The specific growth temperature may be selected by the skilled artisan.

Figure 1:
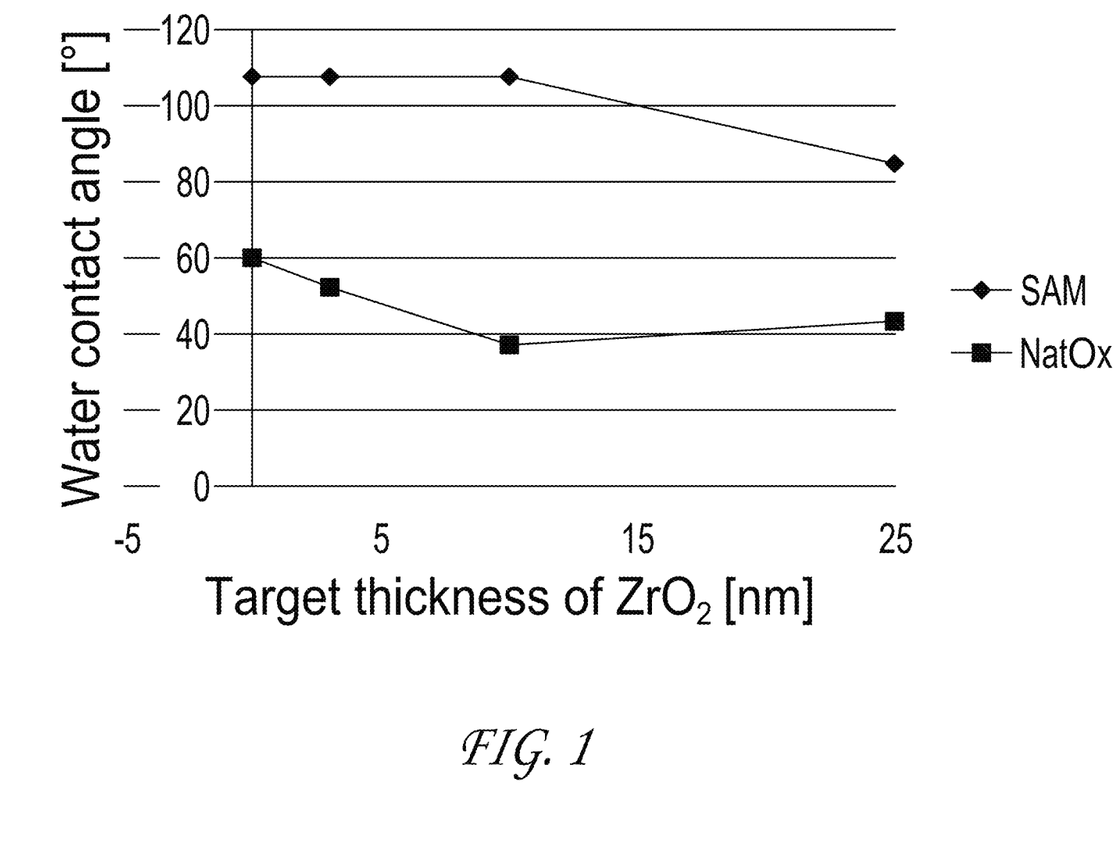
FIG. 1 is graph of the contact angle of $ZrO_2$ at various target thicknesses when deposited at 300° C. on either native oxide (NatOx) on a silicon substrate or a self-assembled monolayer (SAM) of trichloro(octadecyl)silane deposited on on native oxide on a silicon substrate.

Referring to FIG. 1, in some embodiments a substrate comprising a first surface and a second organic surface is provided 11. As discussed above, in some embodiments the first surface may be, for example, a metal or metallic surface or a dielectric surface.

The substrate is contacted with a first vapor phase hydrophobic reactant 12 for a first exposure period. The hydrophobic reactant may, for example, comprise a metal and may have the formula I as described below. In some embodiments the first precursor exposure period is from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments, such as when batch reactors may be used, exposure periods of greater than 60 seconds may be employed.

Excess first hydrophobic reactant and reaction by products, if any, are removed 13. Excess first reactant and reaction by products may be removed by purging, for example with an inert gas, and/or by vacuum. The purge step may be carried out for a time sufficient to remove substantially all first reactant. In some embodiments the purge is carried out for about 0.1 to about 60 seconds, about 0.5 to about 20 second or about 1 to about 10 seconds. Depending on the circumstances, in some embodiments a purge of longer than about 60 seconds can be carried out.

After excess first reactant is removed, the substrate is contacted with a second vapor phase reactant 14 for a second exposure period. In some embodiments the substrate is exposed to the second reactant for a period from about 0.01 seconds to about 60 seconds, about 0.05 seconds to about 30 seconds, about 0.1 seconds to about 10 seconds or about 0.2 seconds to about 5 seconds. The optimum exposure period can be readily determined by the skilled artisan based on the particular circumstances. In some embodiments where batch reactors may be used, exposure periods of greater than 60 seconds may be employed.

Excess second reactant and reaction by products, if any, are subsequently removed 15. Excess second reactant and reaction by products may be removed by purging, for example with an inert gas, and/or by vacuum. This second purge step may be carried out for a time sufficient to remove substantially all second reactant. In some embodiments the second purge is carried out for about 0.2 to about 60 seconds, about 0.5 to about 20 second or about 1 to about 10 seconds. Depending on the circumstances, in some embodiments a second purge of longer than about 60 seconds can be carried out.

In block 16 the material is selectively deposited on the first surface relative to the second organic surface. The skilled artisan will appreciate that selective deposition is the result of the above-described actions, 12-15, rather than a separate action. In some embodiments, the above-described actions, blocks 12-15, may be considered a deposition cycle. In some embodiments a deposition cycle may repeated until a film of a desired thickness is selectively deposited. Such a selective deposition cycle can be repeated until a film of desired thickness is selectively deposited on the first surface relative to the second organic surface. In some embodiments the selective deposition cycle is repeated only until a desired level of selectivity is no longer maintained. For example, the selective deposition cycle may be repeated until significant deposition on the organic surface begins to occur.

In some embodiments a metal oxide is selectively deposited by alternately and sequentially contacting a substrate with a first hydrophobic reactant comprising a metal of the metal oxide and a second reactant comprising oxygen. In some embodiments the second reactant is water. The metal oxide may be, for example, $ZrO_2$ or $HfO_2$.

In some embodiments ZrO2 is deposited by an ALD process. A substrate is provided comprising a first surface, such as a metal surface, metallic surface or dielectric surface, and a second organic surface. The ALD process comprises one or more deposition cycles comprising:
contacting the substrate with a first hydrophobic reactant comprising Zr. In some embodiments the first hydrophobic reactant is bis(methylcyclopentadienyl) methoxymethyl Zirconium(IV);
removing excess first hydrophobic reactant;
contacting the substrate with a second reactant comprising oxygen, such as $H_2O$; and
removing excess second reactant.

The deposition cycle may be repeated two or more times to deposit a $ZrO_2$ film of a desired thickness.

In some embodiments a $HfO_2$ film is deposited by a similar process using a first hydrophobic reactant comprising Hf, such as bis(methylcyclopentadienyl) methoxymethyl hafnium (IV).

In some embodiments a selective CVD process comprises contacting a substrate comprising a first surface and a second organic surface with a first hydrophobic metal reactant and a second reactant. In some embodiments a metal oxide such as $ZrO_2$ is selectively deposited by contacting the substrate with a first hydrophobic reactant comprising a metal of the metal oxide and a second reactant comprising oxygen, such as water. In some embodiments the substrate is contacted sequentially with the first and second reactants.

Reactants

As mentioned above, at least one of the reactants in a selective vapor deposition process is a hydrophobic reactant. In some embodiments the hydrophobic reactant comprises a metal.

The hydrophobic reactant comprises one or more hydrophobic ligands. In some embodiments the hydrophobic reactant comprises two to four hydrophobic ligands. In the case of hydrophobic reactants comprising a metal with a valence/oxidation state of n, in some embodiments the hydrophobic precursor comprises n–1 or n–2 hydrophobic ligands.

In some embodiments at least one hydrophobic ligand comprises only C and H. In some embodiments at least one hydrophobic ligand comprises C, H and Si or Ge, but no additional elements.

In some embodiments a hydrophobic ligand is a hydrocarbon ligand. A hydrocarbon ligand may comprise, for example, a C1-C10 hydrocarbon (single, double or triple bonded). In some embodiments the hydrocarbon ligand comprises an alkyl, such as a C1-C5 alkyl, for example a Me, Et, Pr, ᶦPr, Bu, or ᵗBu ligand. In some embodiments the hydrocarbon ligand is an alkenyl, such as a C1-C6 alkenyl. In some embodiments the hydrocarbon ligand is a cyclic hydrocarbon, such as a C3-C8 cyclic hydrocarbon. Examples of C3-C8 hydrocarbon ligands include cyclopentadienyl ligands, cycloheptadienyl ligands, cycloheptatrienyl ligands, cyclohexyl ligands, and derivatives thereof. In some embodiments the hydrocarbon ligand is an aromatic ligand, such as a C6 aromatic ring or derivative thereof.

In some embodiments the hydrophobic reactant comprises no hydrophilic ligands. However, in some embodiments the hydrophobic reactant may comprise one or two hydrophilic ligands. In some embodiments a hydrophilic ligand comprises nitrogen, oxygen and/or a halogen group.

In some embodiments a hydrophilic ligand may be an alkylamine (—$NR_2$, where each R can be alkyl, hydrogen). In some embodiments the hydrophilic ligand can be —$NMe_2$, —NEtMe, or —$NEt_2$.

In some embodiments a hydrophilic ligand is an alkoxide, for example —OMe, —OEt, —$O^iPr$, or —$O^tBu$.

In some embodiments a hydrophilic ligand comprises a halide, such as a chloride, fluoride or other halide.

In some embodiments the hydrophobic precursor has the formula:

$$L_nMX_y \quad (I)$$

In formula I, n is from 1-6. In some embodiments n is from 1-4 or 3-4.

In formula I y is from 0-2. In some embodiments y is from 0-1.

In formula I L is a hydrophobic ligand, as discussed above. In some embodiments L is Cp. In some embodiments L is a C1-C4 alkyl ligand.

In formula I X is hydrophilic ligand, as discussed above. For example, in some embodiments X is an alkylamine, alkoxide or halide ligand.

In formula I M is metal (including group 13 elements, B, Ga). In some embodiments M has an oxidation state of +I up to +VI. In some embodiments M has an oxidation state of +IV to +V. In some embodiments the metal is not W. In some embodiments the metal is not Mo. In some embodiments the metal is not Co. In some embodiments the metal is not Fe. In some embodiments the metal is not Ni. In some embodiments the metal is not noble metal. For example, in some embodiments the metal is not Ru.

In some embodiments M can be a transition metal. In some embodiments M is Ti, Ta, Nb, W, Mo, Hf, Zr, V, or Cr. In some embodiments M is Co, Fe, Ni, Cu, or Zn. In some embodiments M is Hf, Zr, Ta or Nb.

In some embodiments M can be a rare earth metal. In some embodiments M is La, Ce, or Y.

In some embodiments M can be a metal from groups of 2-13. In some embodiments M is Ba, Sr, Mg, Ca, or Sc.

In some embodiments M is not a noble metal.

In some embodiments M is Zr.

In some embodiments the hydrophobic reactant is Bis (methylcyclopentadienyl) methoxymethyl zirconium(IV).

In some embodiments the hydrophobic reactant is bis (methylcyclopentadienyl) methoxymethyl hafnium(IV).

In some embodiments the second reactant contributes one or more elements to the material that is selectively deposited. For example, the second reactant can be an oxygen precursor used to deposit a metal oxide or a nitrogen precursor used to deposit a metal nitride.

In some embodiments the second reactant comprises an oxygen precursor. For example, the second reactant may comprise one or more of $H_2O$, $O_3$, $H_2O_2$, oxygen-containing plasma, ions, radicals, atomic O or excited species of oxygen.

In some embodiments the second reactant comprises a nitrogen precursor. For example, the second reactant may comprise one or more of $NH_3$, $N_2H_4$, nitrogen-containing plasma, ions, radicals, atomic N or excited species comprising N. In some embodiments the nitrogen reactant can comprise a mixture with corresponding hydrogen species.

In some embodiments the second reactant may be provided along with and/or with the aid of an inert gas, such as nitrogen or a noble gas such as Ar or He.

In some embodiments other reactants can be utilize that contribute elements other than N or O to the deposited material. These reactants may be used in addition to a N or O second reactant, or may themselves serve as a second reactant. For example, in some embodiments a sulfur reactant such as $H_2S$ or another reactant with an S—H bond may be used to deposit a sulfur-containing material, such as a sulphide. In some embodiments a carbon reactant may be used to deposit carbon-containing material or a silicon reactant may be used to deposit a silicon-containing material, such as a silicide.

In some embodiments the second reactant may contribute two or more elements to the material being deposited.

In some embodiments a second reactant does not contribute an element to the film being selectively deposited. For example, in some embodiments a second (or additional) reactant may be used that aids in depositing a metal or metallic film, such as an elemental metal film. For example, in some embodiments the second reactant may comprise hydrogen.

Subsequent Processing

In some embodiments further processing may be carried out subsequent to the selective deposition process. For example, in some embodiments the substrate may be subjected to an etch process to remove at least a portion of the deposited material, for example from the organic surface. In some embodiments an etch process subsequent to selective deposition may partially remove deposited material from the first surface and substantially completely remove material that was deposited on the second organic surface of the substrate despite the selective nature of the deposition.

Due to the selective nature of the deposition processes described herein, the amount of material deposited on the second organic surface of the substrate may be substantially less than the amount of material deposited on the first surface of the substrate. Therefore, an etch process may completely remove deposited material from the second organic surface of the substrate while deposited material may remain on the first surface of the substrate. Organic material can be partially or fully removed after deposition.

Examples $ZrO_2$ was deposited by ALD on various substrates and under various reaction conditions in a Pulsar® 2000 reactor. Bis(methylcyclopentadienyl) methoxymethyl Zirconium (IV) and $H_2O$ were used as the first hydrophobic reactant and second reactant, respectively. Deposition of $ZrO_2$ was not observed on substrates comprising a surface with a SAM layer (Trichloro(octadecyl)silane) or a polyimide surface. See FIGS. 1-4.

In the tests on the SAM surface, two coupon substrates, a natox/Si and SAM/natox/Si, were placed into the ALD reactor where the $ZrO_2$ deposition processes were carried out. The contact angle (CA) measurement that indicates the hydrophobic or hydrophilic nature of the surface was used to study the passive nature of the SAM layer on the natox/Si coupon. The contact angle was measured before and after the $ZrO_2$ deposition from both substrates.

Before $ZrO_2$ deposition the contact angle of the SAM layer was very high (>105°) indicating very hydrophobic nature of the surface (—$CH_x$) while the .natox substrate gave a very low value, indicating hydrophilic nature of the surface (Si—OH). As can be seen from FIG. 1 the contact angle of SAM/natox/Si coupon exposed to the $ZrO_2$ process (10 nm layer) stayed the same as before deposition indicating no growth of $ZrO_2$ on SAM.

Figure 2A:
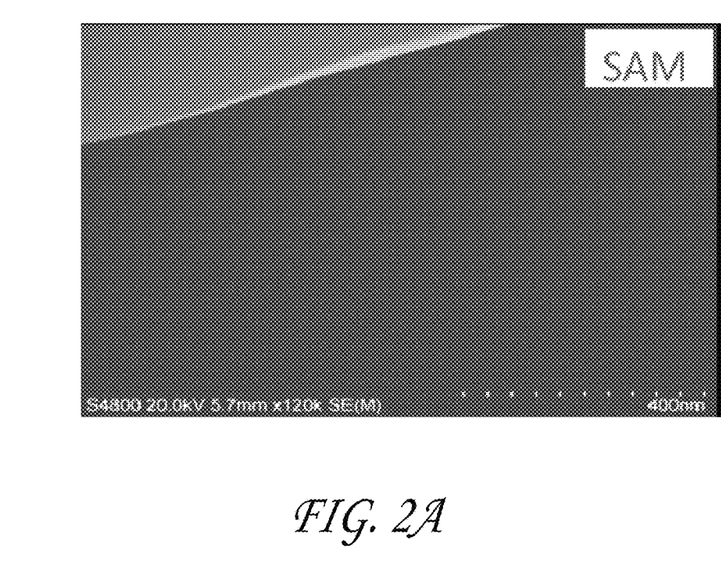
Figure 2B:
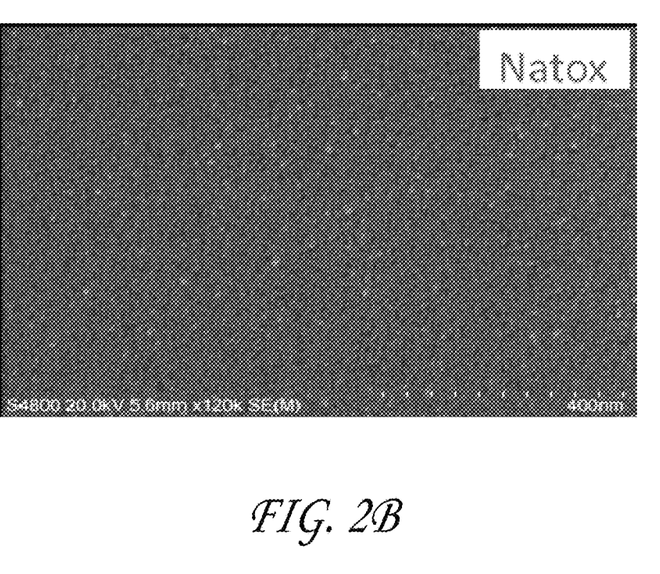
FIG. 2B shows that a $ZrO_2$ film was deposited on the native oxide surface.
Figure 3A:
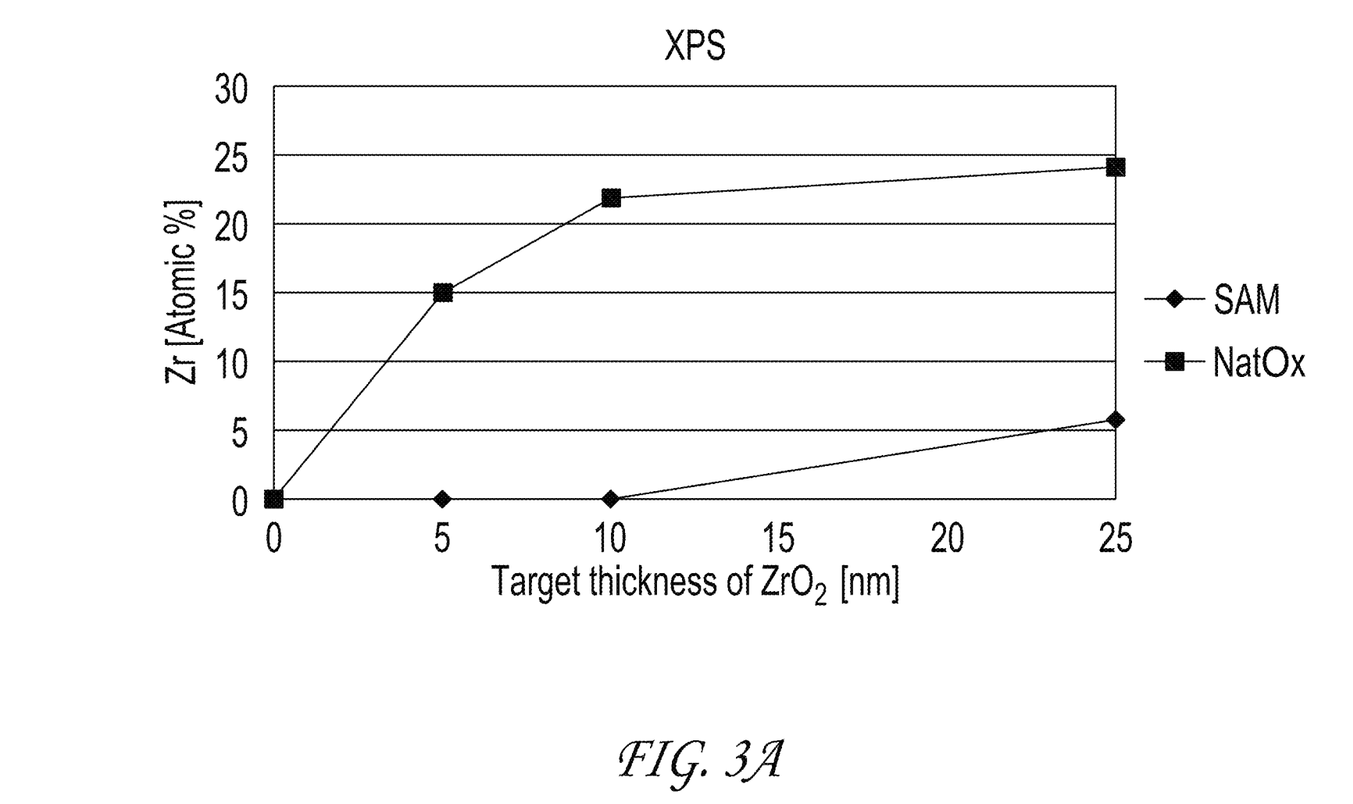
FIG. 3A shows XPS analysis of the substrates of FIG. 1. No Zr was observed on the SAM surface up to a target thickness of 10 nm of $ZrO_2$.
Figure 3B:
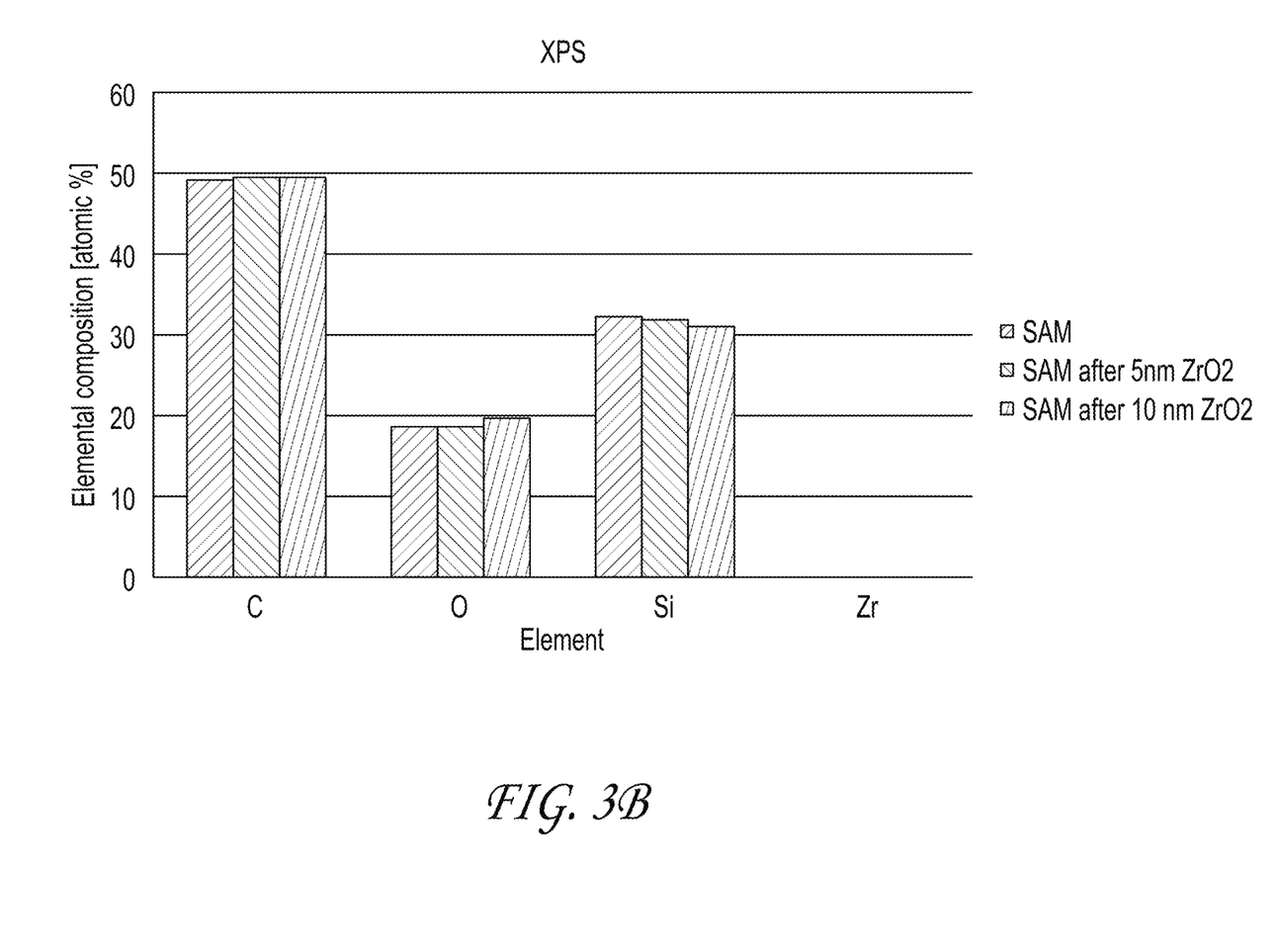
FIG. 3B shows XPS analysis of deposition on a SAM surface with a target thickness of 5 or 10 nm of $ZrO_2$.

The XPS results agreed with the CA measurements and showed there was no Zr on SAMs even after 10 nm $ZrO_2$ deposition (FIG. 2). Also STEM revealed that there was no $ZrO_2$ on the SAM surface, while on natox a 10 nm $ZrO_2$ layer was deposited (FIG. 3). After 25 nm deposition XPS showed some Zr on the SAM surface; however the SAM coupon had been in the reactor for more than 5 hours, which could have caused the degradation of SAM (FIG. 2).

Figure 4A:
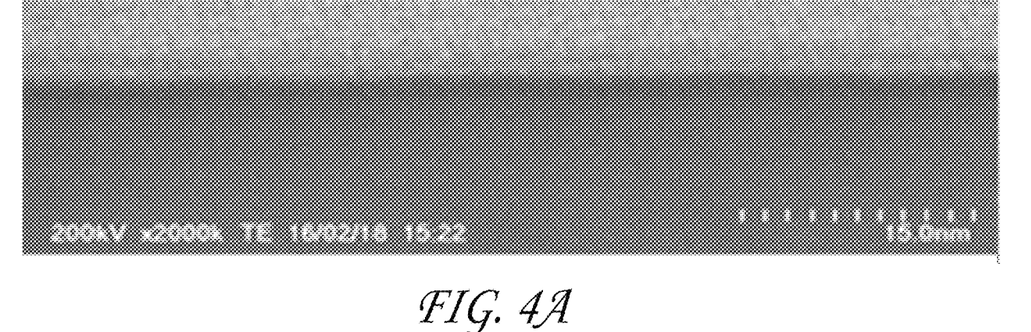
FIG. 4A is an STEM image of a SAM on a silicon substrate.
Figure 4B:
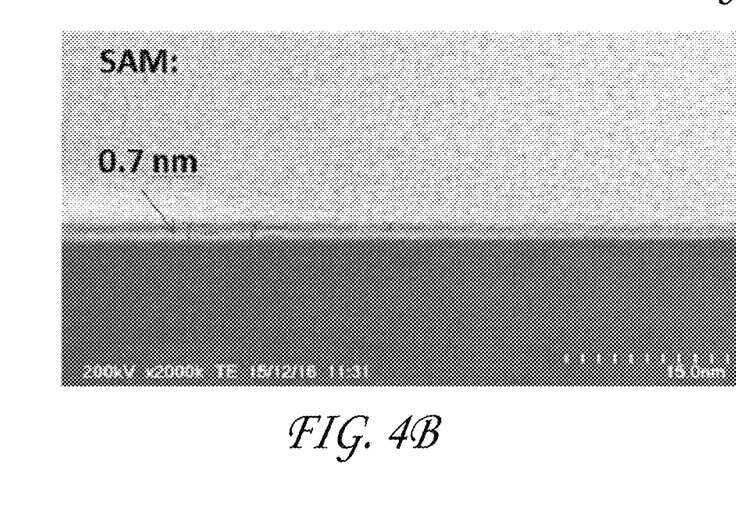
FIG. 4B is an STEM image showing that $ZrO_2$ is not deposited on a SAM surface on a silicon substrate by ALD using bis(methylcyclopentadienyl) methoxymethyl zirconium (IV) and $H_2O$.
Figure 4C:
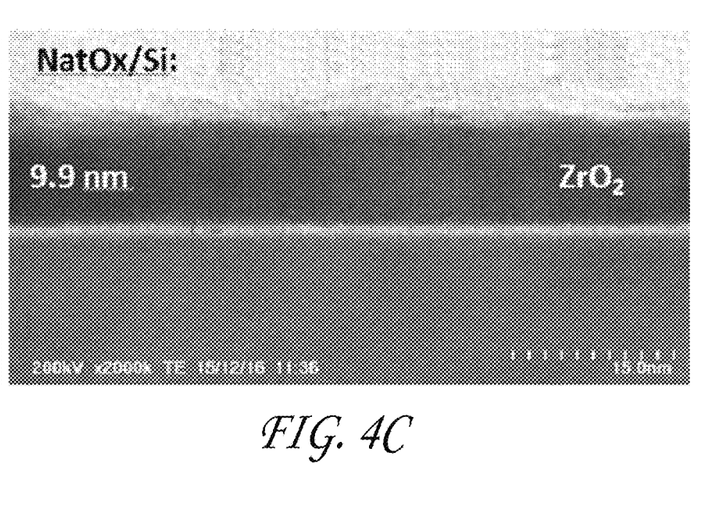
FIG. 4C is an STEM image showing deposition of $ZrO_2$ on a native oxide surface on a silicon substrate by ALD using bis(methylcyclopentadienyl) methoxymethyl zirconium (IV) and $H_2O$.
Figure 5:
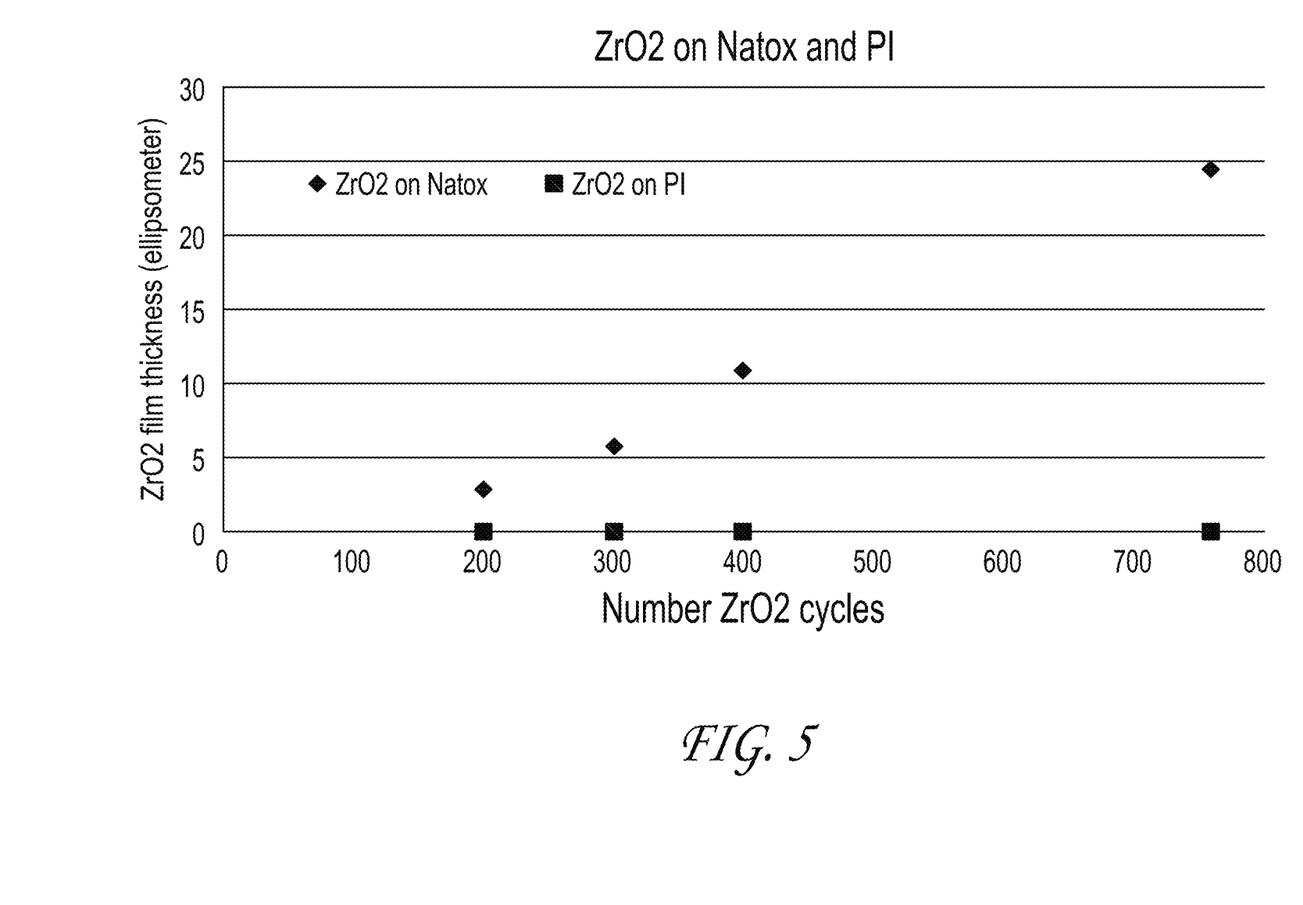
FIG. 5 shows $ZrO_2$ film thickness as a function of $ZrO_2$ deposition cycles on both native oxide (Natox) and polyimide (PI) surfaces on silicon substrates.
Figure 6:
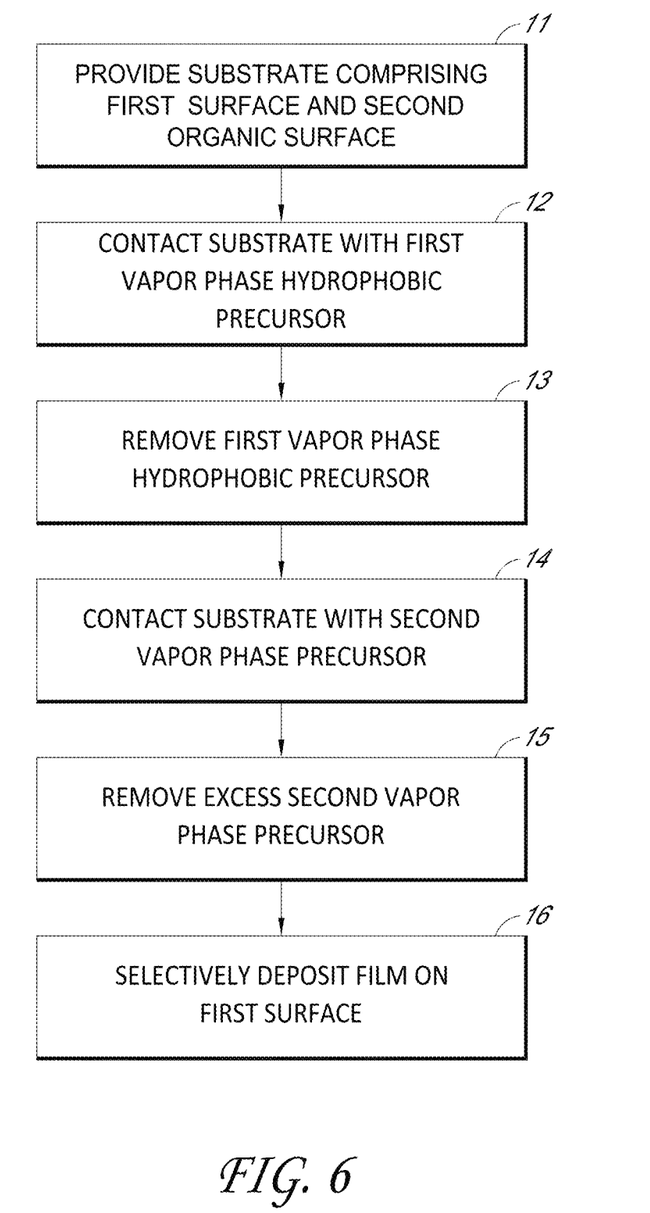
FIG. 6 is a flow chart of an ALD process for selective deposition on a first surface relative to a second organic surface according to some embodiments.

In FIG. 4 and in Table 1 it is shown that the $ZrO_2$ grows on natox ($SiO_2$) but not significantly on polyimide. Even after almost 25 nm of $ZrO_2$ was deposited on the natox ($SiO_2$) surface there was no significant $ZrO_2$ on the polyimide surface, even though on the surface of polyimide there are hydrophilic surface groups present like C—$NH_2$.

TABLE 1

XPS analysis of polyimide samples after different $ZrO_2$ cycle numbers, 100-760, on natox and polyimide surfaces as well as on H-plasma damaged polyimide surface. Only a very small amount of ZrO2 was detected on polyimide surfaces even after 760 cycles. The H plasma damaged surface also inhibited $ZrO_2$ growth.

| Element | 100c $ZrO_2$ on PI | 200c $ZrO_2$ on PI | 400c $ZrO_2$ on PI | 760c $ZrO_2$ on PI | 400c $ZrO_2$ on Natox | 400c $ZrO_2$ on plasma damaged PI |
|---|---|---|---|---|---|---|
| C | 70.8 | 69.4 | 68.9 | 67.5 | 15.6 | 70.2 |
| O | 18.2 | 19.0 | 19.6 | 21.3 | 57.0 | 18.5 |
| N | 8.4 | 8.3 | 7.7 | 6.6 | — | 8.2 |
| Si | 2.55 | 3.2 | 3.2 | 3.2 | — | 2.8 |
| Zr | 0.05 | 0.1 | 0.6 | 1.4 | 25.2 | 0.3 |

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A vapor deposition process for selectively depositing a material on a first surface of a substrate relative to a second organic surface, the method comprising:
   contacting the substrate with a first vapor phase hydrophobic reactant; and
   contacting the substrate with a second vapor phase reactant,
   wherein the material is deposited selectively on the first surface relative to the second organic surface.

2. The method of claim 1, wherein the material is a metal oxide.

3. The method of claim 1, wherein the first hydrophobic reactant comprises at least one hydrophobic hydrocarbon ligand.

4. The method of claim 1, wherein the first hydrophobic reactant comprises one or two hydrophilic ligands.

5. The method of claim 4, wherein the hydrophilic ligand comprises an alkylamine, alkoxide or halide.

6. The method of claim 1, wherein the second reactant comprises $H_2O$, $O_3$, $H_2O_2$, oxygen plasma, oxygen ions, oxygen radicals or excited species of oxygen.

7. The method of claim 1, wherein the first surface is a metal surface, a semi-metal surface, an oxidized metal surface or an oxidized semi-metal surface.

8. The method of claim 1, wherein the first surface is a dielectric surface.

9. The method of claim 1, wherein the second organic surface comprises a self-assembled monolayer (SAM) or a directed self-assembled layer (DSA).

10. The method of claim 1, wherein the second organic surface comprises a polymer.

11. The method of claim 10, wherein the polymer is a polyimide, polyamide, polyuria, or polystyrene.

12. The method of claim 1, wherein the vapor deposition process is a cyclic chemical vapor deposition process.

13. The method of claim 1, wherein the vapor deposition process is an atomic layer deposition process.

14. The method of claim 1, wherein the material is deposited on the first surface relative to the second surface with a selectivity of greater than about 50%.

15. A method for selectively depositing a metal oxide on a first surface of a substrate relative to a second surface, the method comprising:
   contacting the substrate with a first hydrophobic reactant comprising metal; and
   contacting the substrate with a second reactant,
   wherein the first substrate surface comprises a metal or semimetal containing material and the second substrate surface comprises an organic material.

16. The method of claim 15, wherein the metal oxide is $ZrO_2$.

17. The method of claim 15, wherein the first hydrophobic metal reactant has the formula $L_nMX_y$, in which:
   n is from 1 to 6;
   y is from 0 to 2;
   L is a hydrophobic ligand;
   X is a hydrophilic ligand; and
   M is a metal.

18. The method of claim 17, wherein M is selected from Hf, Zr, Ta and Nb.

19. The method of claim 17, wherein L is a Cp or C1-C4 alkyl.

20. The method of claim 15, wherein the second reactant comprises $H_2O$.

21. The method of claim 15, wherein the first surface is a dielectric surface.

22. The method of claim 15, wherein the second surface comprises a SAM.

23. The method of claim 15, wherein the metal oxide is selectively deposited on the first surface of the substrate relative to the second surface with a selectivity of greater than 95%.

* * * * *